US008587256B2

(12) United States Patent
Tae et al.

(10) Patent No.: US 8,587,256 B2
(45) Date of Patent: Nov. 19, 2013

(54) BATTERY MANAGEMENT SYSTEM AND DRIVING METHOD FOR THE SYSTEM

(75) Inventors: Yongjun Tae, Suwon-si (KR); Andre Boehm, Suwon-si (KR)

(73) Assignees: Samsung SDI Co., Ltd., Yongin-si, Gyeonggi-Do (KR); Robert Bosch GmbH, Stuttgart (DE)

( * ) Notice: Subject to any disclaimer, the term of this patent is extended or adjusted under 35 U.S.C. 154(b) by 661 days.

(21) Appl. No.: 12/805,258

(22) Filed: Jul. 21, 2010

(65) Prior Publication Data

US 2011/0095765 A1 Apr. 28, 2011

(30) Foreign Application Priority Data

Oct. 19, 2009 (KR) .................. 10-2009-0099300

(51) Int. Cl.
*H02J 7/00* (2006.01)
(52) U.S. Cl.
USPC .......................................... 320/132; 324/434
(58) Field of Classification Search
USPC .......................................................... 320/132
See application file for complete search history.

(56) References Cited

U.S. PATENT DOCUMENTS

| | | | |
|---|---|---|---|
| 6,255,803 B1 | 7/2001 | Ishihara et al. | |
| 6,469,512 B2 | 10/2002 | Singh et al. | |
| 2001/0033169 A1 | 10/2001 | Singh et al. | |
| 2007/0145948 A1* | 6/2007 | Lim et al. ...................... | 320/132 |
| 2009/0027056 A1* | 1/2009 | Huang et al. .................. | 320/132 |
| 2009/0099802 A1* | 4/2009 | Barsoukov et al. ............. | 702/65 |
| 2010/0004885 A1 | 1/2010 | Nakanishi | |

FOREIGN PATENT DOCUMENTS

| | | |
|---|---|---|
| EP | 1076242 A2 | 2/2001 |
| JP | 2000-092732 A | 3/2000 |
| JP | 2001-116811 A | 4/2001 |
| JP | 2005-322456 A | 11/2005 |
| JP | 2006-337155 A | 12/2006 |
| JP | 2008-288192 A | 11/2008 |
| KR | 10-2002-0054779 A | 7/2002 |
| KR | 10-2002-0054829 A | 7/2002 |
| KR | 10-2003-0092393 A | 12/2003 |
| KR | 10-2004-0005117 A | 1/2004 |
| WO | WO 01/51947 A1 | 7/2001 |

OTHER PUBLICATIONS

European Search Report in EP 10173771.6-1242, dated Jul. 27, 2011 (Tae, et al.).
Notice of Allowance issued in corresponding Korean application, 10-2009-0099300, dated Mar. 17, 2011.

* cited by examiner

*Primary Examiner* — Edward Tso
*Assistant Examiner* — Robert Grant
(74) *Attorney, Agent, or Firm* — Lee & Morse, P.C.

(57) ABSTRACT

A BMS and driving method, the BMS including a sensing unit sensing voltages and currents of battery cells and an MCU determining an SOC of the battery cells and controlling charging and discharging based on cell voltages and currents of the battery cells, wherein the MCU includes an SOC measurer measuring first SOCs and, after a predetermined duration, second SOCs of the battery cells; and a controller determining whether a first difference value between a maximum second SOC value and the second SOCs of each battery cell is greater than a first reference value or determining whether a second difference value between the first and second SOCs of respective battery cells is greater than a second reference value, and determining which battery cell is shorted when the first difference value is greater than the first reference value or when the second difference value is greater than the second reference value.

12 Claims, 5 Drawing Sheets

BATTERY MANAGEMENT SYSTEM AND DRIVING METHOD FOR THE SYSTEM

BACKGROUND

1. Field

Embodiments relate to a battery management system and a driving method for the system.

2. Description of the Related Art

Automobiles powered by internal combustion engines using gasoline or fuel oil as a primary fuel are severely contributing to atmospheric and other forms of environmental pollution. As a result, electric and hybrid vehicles have recently been developed to reduce the amounts of pollutants generated.

An electric vehicle is one that uses a battery-powered engine for locomotion through harnessing electric power output from batteries. Such electric vehicles may use a battery pack including a plurality of battery cells as the primary driving power source. The battery cells may be secondary battery cells that are capable of being charged and discharged. Electric vehicles may be advantageous in that they do not emit exhaust gases and have low operating noise levels.

As intermediaries between automobiles reliant on internal combustion engines and electric vehicles, hybrids are automobiles that employ at least two sources of motive power, e.g., an internal combustion engine and a battery-powered motor. Hybrid vehicles are currently being developed that use, e.g., a combination of an internal combustion engine and a fuel cell (that triggers a chemical reaction which directly generates electric energy, through a continuous feed of hydrogen and oxygen), a combination of a battery and a fuel cell, etc.

SUMMARY

Embodiments are directed to a battery management system and a driving method for the system, which represent advances over the related art.

It is a feature of an embodiment to provide a battery management system and a driving method for the system, the system being capable of detecting shorted battery cells within a plurality of battery cells based on states of charge of the battery cells.

At least one of the above and other features and advantages may be realized by providing a battery management system including a sensing unit, the sensing unit sensing cell voltages and cell currents of a plurality of battery cells; and a Main Control Unit (MCU), the MCU determining a State of Charge (SOC) of the plurality of the battery cells and controlling charging and discharging based on the cell voltages and cell currents of the plurality of the battery cells, wherein the MCU includes an SOC measurer, the SOC measurer measuring first SOCs of each of the battery cells and, after a predetermined duration, second SOCs of each of the battery cells; and a controller, the controller determining whether a first difference value between a maximum value from among the second SOCs of the plurality of battery cells and the second SOCs of each battery cell is greater than a first reference value or determining whether a second difference value between the first and second SOCs of respective battery cells is greater than a second reference value, and determining which battery cell among the plurality of the battery cells is a shorted battery cell when the first difference value for the battery cell is greater than the first reference value or when the second difference value for the battery cell is greater than the second reference value.

The MCU may further include a data storage, the data storage storing the first SOCs, the second SOCs, the first reference value, and the second reference value.

The controller may be configured to determine whether the second difference values are greater than the second reference value if the first difference values for all the battery cells are less than the first reference value.

The controller may be configured to determine whether the first difference values are greater than the first reference value if the second difference values for all the battery cells are less than the second reference value.

The MCU may be configured to transmit information regarding the shorted battery cell to an Engine Control Unit (ECU), and the ECU may be configured to display the information regarding the shorted battery cell on a display device.

At least one of the above and other features and advantages may also be realized by providing a driving method for a battery management system, the driving method including determining battery cell States of Charge (SOC) by determining first SOCs of each of a plurality of battery cells and, after a certain duration, determining second SOCs of each of the battery cells; comparing difference values with reference values through determining whether a first difference value between a maximum value from among the plurality of second SOCs of the battery cells and the second SOC of each battery cell is greater than a first reference value, or determining whether a second difference value between the first and second SOCs of each of the battery cells is greater than a second reference value; and determining a battery cell from among the plurality of battery cells to be a shorted battery cell when the first difference value for the battery cell is greater than the first reference value, or when the second difference value for the battery cell is greater than the second reference value.

The comparing of the difference values with the reference values may include the determining whether the first difference value between the maximum value from among the plurality of second SOCs of the battery cells and the second SOC of each battery cell is greater than the first reference value and conditionally also may include the determining whether the second difference value between the first and second SOCs of each of the battery cells is greater than the second reference value and wherein the determining whether the first difference value between the maximum value from among the plurality of second SOCs and the second SOC of each battery cell may be performed prior to conditionally determining whether the second difference value between the first and second SOCs is greater than the second reference value.

In the comparing of the difference values with the reference values, determining whether the second difference values are greater than the second reference values may occur on the condition that the first difference values for all the battery cells are less than the first reference value.

The comparing of the difference values with the reference values may include determining whether the second difference value between the first and second SOCs of each battery cell is greater than the second reference value and conditionally also may include determining whether the first difference value between the maximum value from among the plurality of second SOCs of the battery cells and the second SOC of each battery cell is greater than the first reference value and wherein the determining whether the second difference value between the first and second SOCs of each battery cell may be performed prior to conditionally determining whether the first difference value between the maximum value from among the plurality of second SOCs and the second SOC of each battery cell is greater than the first reference value.

In the comparing of the difference values with the reference values, determining whether the first difference values are greater than the first reference values may occur on the condition that the second difference values for all the battery cells are less than the second reference value.

The driving method may further include issuing an alert on the shorted battery cells by displaying information regarding the shorted battery cells.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
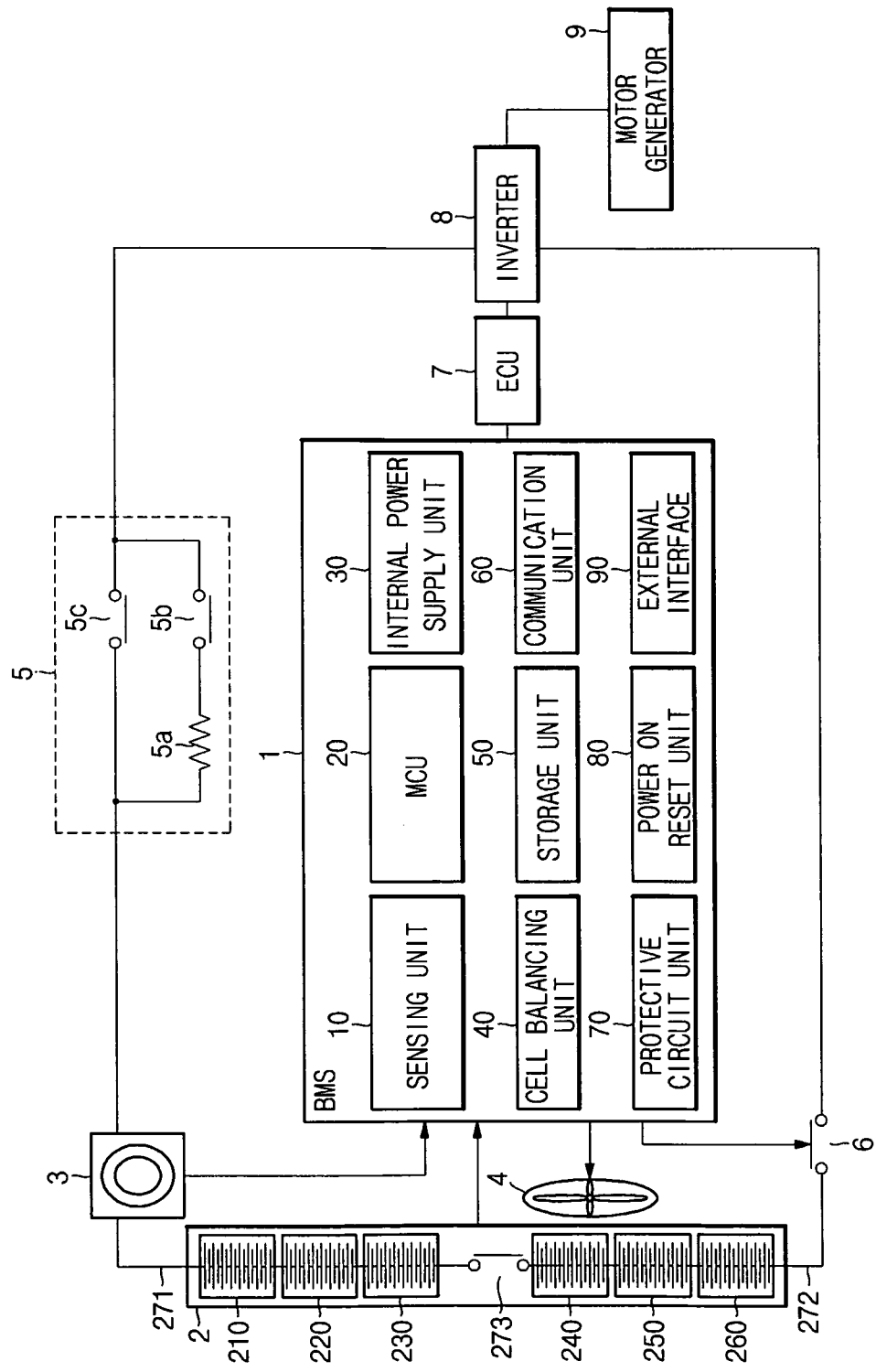
FIG. 1 illustrates a block diagram of a battery, a battery management system (BMS), and peripheral devices of the BMS according to an embodiment.

Korean Patent Application No. 10-2009-0099300, filed on Oct. 19, 2009, in the Korean Intellectual Property Office, and entitled: "Battery Management System and Driving Method for the System," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

In the entire specification, it is to be noticed that when a certain element is "connected" to another element, it means that they are "directly connected" to each other or "electrically connected" to each other with another device being interposed therebetween. It is also to be noticed that the term "comprising" or "including" used in the entire specification should not be interpreted as being restricted to the means listed thereafter and does not exclude other elements.

FIG. 1 illustrates a block diagram of a battery, a battery management system (BMS), and peripheral devices of the BMS according to an embodiment.

Referring to FIG. 1, an automotive system may include a BMS 1, a battery 2, a current sensor 3, a cooling fan 4, an inrush current preventer 5, a main switch 6, an Engine Control Unit (ECU) 7, an inverter 8, and a motor generator 9.

Description will commence with the peripheral devices connected at a front end of the BMS 1.

The battery 2 may include a plurality of sub packs 210, 220, 230, 240, 250, and 260 linearly connected to one another, output terminals 271 and 272, and a safety switch 273 connected between the sub packs 230 and 240.

The plurality of sub packs 210, 220, 230, 240, 250, and 260 include six sub packs only as an example, but the embodiments are not limited thereto. The sub packs may be identified as a first sub pack 210, a second sub pack 220, a third sub pack 230, a fourth sub pack 240, a fifth sub pack 250, and a sixth sub pack 260. As illustrated in FIG. 1, the first sub pack 210 through the sixth sub pack 260 may each include eight (8) chargeable battery cells interconnected in series, so that the battery 2 may include a total of forty-eight (48) battery cells. Again, however, the embodiments are not limited thereto. Here, while each sub pack has been illustrated grouping a plurality of battery cells into a single group, in an implementation, the battery 2 may alternatively be configured with, e.g., 48 battery cells directly interconnected without being grouped by the first sub pack 210 through the sixth sub, pack 260.

The output terminals 271 and 272 may be connected to the vehicle's inverter 8 and motor generator 9 to supply electric energy to the vehicle's motor.

The safety switch 273, connected between the third sub pack 230 and the fourth sub pack 240, is a switch that may be manually switched on and off to provide safety to a technician when replacing or servicing the battery 2. While FIG. 1 illustrates the safety switch 273 being connected between the third sub pack 230 and the fourth sub pack 240, the embodiments are not limited thereto. While not illustrated, a fuse may be serially connected to the safety switch 273. The fuse may prevent overcurrent from being transmitted to the battery 2 in the event of a short in the battery 2. That is, in the event of an overcurrent, the fuse may be severed to prevent the overcurrent from being transmitted to the battery 2.

The current sensor 3 may measure an output current of the battery 2 to output to a sensing unit 10 of the BMS 1. In an implementation, the current sensor 3 may be, e.g., a Hall CT (Current Transformer) that employs a Hall device to measure current and output an analog current signal corresponding to the measured current.

The cooling fan 4 may operate based on control signals from the BMS 1 to reduce heat that may be generated by charging and discharging of the battery 2. Reducing the heat may prevent degradation and lowered charge/discharge efficiency of the battery 2, which may be caused by elevated temperatures.

The inrush current preventer 5 may be disposed between the battery 2 and inverter 8 to prevent an inrush current from being applied to the inverter 8 from the battery 2. Accordingly, damage to the inverter 8 due to the inrush current may be prevented. The inrush current preventer 5 may include a precharge resistor 5a, a precharge relay 5b, and a main relay 5c. Here, when the precharge relay 5b is switched on and an inrush current is blocked by the precharge resistor 5a, current may be slowly applied to the inverter 8. Then, the precharge relay 5b may be switched off; and the main relay 5c may be switched on so that normal current from the battery 2 may be safely applied to the inverter 8.

When abnormalities, e.g., excessive voltage, overcurrent, and/or high temperature, occur, the main switch 6 may disconnect the battery 2 from the inverter 8 in accordance with a control signal from the BMS 1 or the ECU 7 of the vehicle.

The BMS 1 may include a sensing unit 10, a Main Control Unit (MCU) 20, an internal power supply unit 30, a cell balancing unit 40, a storage unit 50, a communication unit 60, a protective circuit unit 70, a power on reset unit 80, and an external interface 90.

The sensing unit 10 may measure an overall pack current and an overall pack voltage of the battery 2 as well as a cell voltage, cell current, cell temperature, and ambient temperature of each of the plurality of battery cells. The sensing unit 10 may transmit measurement data to the MCU 20.

The MCU 20 may calculate a State of Charge (hereinafter referred to as "SOC"), a State of Health (hereinafter referred to as "SOH"), etc. of the battery 2. The MCU 20 may also control charging/discharging of the battery 2 based on the measurement data transmitted from the sensing unit 10 of the overall pack current and the overall pack voltage of the battery 2 as well as the cell voltage, cell current, cell temperature, and ambient temperature of each of the plurality of battery cells. The MCU 20 may also determine an Open Circuit Voltage (OCV) for each in the plurality of battery cells, using cell voltages and cell currents for each of the battery cells. The MCU 20 may determine the SOC for each of the battery cells using the OCVs and may use values of SOC differences between the battery cells to detect shorted battery cells from among the plurality of battery cells. The MCU 20 may transmit information regarding the shorted battery cells to the ECU 7. Shorted battery cells may be battery cells within which positive electrodes and negative electrodes electrically contact one another, thereby reducing voltage. In particular, a sudden short may occur from an abrupt voltage drop in a battery cell caused by active materials of a positive electrode or negative electrode penetrating and causing damage to an insulating separator interposed between the positive electrode and the negative electrode.

The internal power supply unit 30 may generally be a device that uses an auxiliary battery to supply power to the BMS 1.

The cell balancing unit 40 may balance the SOCs of respective battery cells. In particular, the cell balancing unit 40 may discharge battery cells that have comparatively higher SOCs, and charge battery cells with comparatively lower SOCs.

When the BMS 1 is switched off, the storage unit 50 may store data regarding current SOCs, SOHs, etc. In an implementation, the storage unit 50 may be an Electrically Erasable Programmable Read-Only Memory (EEPROM), a non-volatile storage device capable of electrically writing and erasing.

The communication unit 60 may communicate with a control unit for the driving power generating device of the vehicle.

The protective circuit unit 70 may be a circuit that uses firmware to protect the BMS 1 from, e.g., external shock, overcurrent, high voltage, etc.

The power on reset unit 80 may reset the entire system when the BMS 1 is switched on.

The external interface 90 may be a device for connecting the cooling fan 4, main switch 6, and other peripheral devices of the BMS 1 to the MCU 20. While only the cooling fan 4 and main switch 6 are illustrated, the peripheral devices are not limited thereto.

The ECU 7 may determine torque information based on data from the vehicle's accelerator, brake, speedometer, etc., and may control output from the motor generator 9 to match the torque information. That is, the ECU 7 may perform switching control of the inverter 8 to match output from the motor generator 9 to the torque information. In addition, the ECU 7 may receive SOC data of the battery 2 transmitted from the MCU 20 through the communication unit 60 of the BMS 1, and may adjust the SOC of the battery 2 to a target value, e.g., about 55%. In an implementation, if the data transmitted from the MCU 20 indicates that the SOC of the battery 2 is less than about 55%, a switch of the inverter 8 may be controlled to direct power to the battery 2 and charge the battery 2, thus, the pack current (I) may be a '+' value. Should the SOC be greater than about 55%, the switch of the inverter 8 may be controlled to direct power toward the motor generator 9 and discharge the battery 2, whereupon the pack current (I) may be a '−' value. Furthermore, the ECU 7 may receive data regarding SOH of the battery 2 transmitted from the MCU 20 through the communication unit 60 of the BMS 1 and may display information regarding the SOH on a display device, e.g., a gauge cluster (not illustrated) of the vehicle, in order to inform a user. Also, the ECU 7 may receive information regarding shorted battery cells from the MCU 20 and may display the information on the display device to alert the user.

The inverter 8 may charge or discharge the battery 2 based on control signals from the ECU 7.

The motor generator 9 may use electric energy from the battery 2 to drive the vehicle, based on torque information transmitted from the ECU 7.

A detailed description on the MCU, which may detect shorted battery cells, will be provided below.

Figure 2:
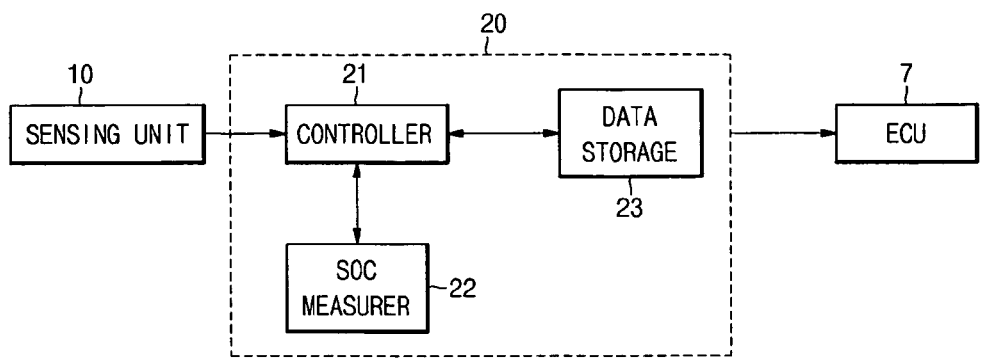
FIG. 2 illustrates a block diagram of a main control unit (MCU) of FIG. 1.

FIG. 2 illustrates a block diagram of the MCU of FIG. 1.

Referring to FIG. 2, the MCU 20 may include, e.g., a controller 21, an SOC measurer 22, and a data storage 23.

The controller 21 may transmit information regarding cell voltage and cell current for each cell of the plurality of battery cells from the sensing unit 10 to the SOC measurer 22. In addition, the controller 21 may instruct the SOC measurer 22 to determine SOCs of each battery cell at predetermined intervals. In an implementation, the controller 21 may instruct the SOC measurer 22 to determine first SOCs of each cell of a plurality of battery cells and then second SOCs of each of the battery cells after a predetermined time after the first SOCs were measured. The first SOCs of each cell of the plurality of battery cells may be SOCs immediately preceding the second SOCs of each cell of the plurality of battery cells within an SOC measurement cycle. The first and the second SOCs of each cell of the plurality of battery cells may be used as a parameter for detecting shorted battery cells from among the plurality of battery cells. The predetermined interval may last from, e.g., about 1 second to about 2 seconds. In particular, the briefer the predetermined interval lasts, the more effective it may be at detecting shorted battery cells due to, e.g., the occurrence of sudden shorts.

The controller 21 may refer to the first SOCs and the second SOCs determined by the SOC measurer 22, and may determine, as shown in Formula 1, below, whether a first difference value (SOC2_max−SOC2_n) between a maximum value (SOC2_max) from among the second SOCs (SOC2_n; where n is a natural number) of each in the plurality of battery cells, and the second SOC (SOC2_n) of each battery cell is greater than a first reference value (REF1). Here, if n is 1, e.g., the SOC2_1 may be the second SOC of a first battery cell, and if n is 2, the SOC2_2 may be the second SOC of a second battery cell.

$$SOC2\_max - SOC2\_n > REF1 \quad \text{[Formula 1]}$$

The controller 21 may determine through Formula 1 that battery cells for which the first difference value (SOC2_max−SOC2_n) is greater than the first reference value (REF1) are shorted battery cells. Here, the reason that the SOCs are used to determine shorted battery cells is because there may be little variation in difference values of SOCs over time.

If the first difference values (SOC2_max−SOC2_n) for all of the plurality of battery cells are less than the first reference value (REF1) and it is determined that there are no shorted battery cells or similar levels of shorts for all the battery cells, the controller 21 may refer to first SOCs and second SOCs determined by the SOC measurer 22, and may determine through Formula 2, below, whether second difference values ($|SOC1\_n-SOC2\_n|$) between first SOCs ($SOC1\_n$; where n is a natural number) and second SOCs ($SOC2\_n$) of each of the plurality of battery cells, are greater than a second reference value (REF2). Formula 2 may represent the absolute value of the difference between $SOC1\_n$ and $SOC2\_n$.

$$|SOC1\_n-SOC2\_n|>REF2 \quad\quad [\text{Formula 2}]$$

The controller 21 may determine through Formula 2 that battery cells for which the second difference value ($|SOC1\_n-SOC2\_n|$) is greater than the second reference value (REF2) are shorted battery cells.

As described above, the controller 21 may detect shorted battery cells from among the plurality of battery cells with Formula 1 or may detect short battery cells with Formula 2 when shorted battery cells are not detected with Formula 1. Conversely, when the controller 21 first detects shorted battery cells with Formula 2, if the second difference value ($|SOC1\_n-SOC2\_n|$) in Formula 2 is less than the second reference value (REF2) and shorted battery cells are not detected or if all the battery cells have negligible shorts, Formula 1 may be used to detect shorted battery cells.

The SOC measurer 22 may use data regarding the cell voltage and cell current of each of a plurality of battery cells from the sensing unit 10 through the controller 21 to obtain the OCV of each of the plurality of battery cells. The SOC measurer 22 may use the OCVs to determine the SOCs of the respective battery cells. Here, when the SOC measurer 22 determines the first SOCs of the battery cells and transmits the first SOC data to the controller 21, the controller 21 may store the first SOC data in the data storage 23. Further, when the SOC measurer 22 determines the second SOCs of the battery cells after the elapse of the predetermined time from the first SOC determinations of the battery cells and transmits the second SOC data to the controller 21, the controller 21 may also store the second SOC data in the data storage 23. Aside from using the OCVs of the battery cells, there are many other ways to determine SOCs of the battery cells, and therefore the battery cell SOC measuring method is not limited to the methods described herein.

As described above, the data storage 23 may store data regarding first SOCs and second SOCs of battery cells determined by the SOC measurer 22. In an implementation, the data storage 23 may also store a first reference value REF1 and a second reference value REF2 used to detect shorted battery cells. In another implementation, the controller 21 may store the first reference value REF1 and the second reference value REF2 used to detect shorted battery cells.

Next, a description will be provided on a simulation for illustrating how shorted battery cells may be detected from a plurality of battery cells, using Formula 1, Formula 2, and the BMS 1 of an embodiment.

Figure 3:
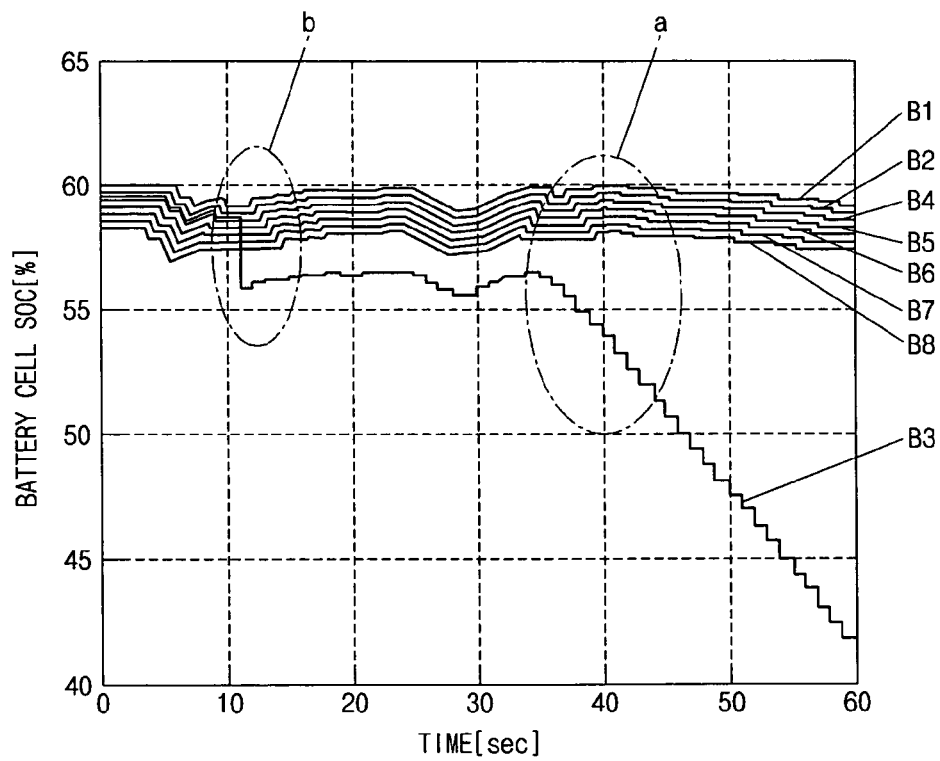
FIG. 3 illustrates a graph showing states of charge (SOCs) of a plurality of battery cells determined by the MCU of FIG. 2.

FIG. 3 illustrates a graph of SOCs of a simulated plurality of battery cells determined by the MCU 20 of FIG. 2.

Referring to FIG. 3, SOCs for battery cells may be illustrated by points in time, and B1, B2, B3, B4, B5, B6, B7, and B8 represent individual battery cells of a battery. In the simulation, the SOCs of the battery cells were measured every second, the first reference value REF1 was designated as 5%, and the second reference value REF2 was designated as 3%.

Referring to FIG. 3, portion 'a' illustrates a battery cell B3 for which, at 40 seconds, a first difference value according to Formula 1 (60%-54%=6%) was greater than the first reference value (5%). Accordingly, it may be determined that B3 is a shorted battery cell. In addition, portion 'b' illustrates B3 for which, at 12 seconds, a second difference value according to Formula 2 (58.8%-55.7%=3.1%) is greater than the second reference value (3%). Accordingly, it may be determined that B3 is a shorted battery cell. Thus, the MCU 20 may determine, through Formula 1 and/or Formula 2, which of the plurality of battery cells are shorted.

Next, a description will be provided for a driving method for a BMS according to an embodiment.

Figure 4:
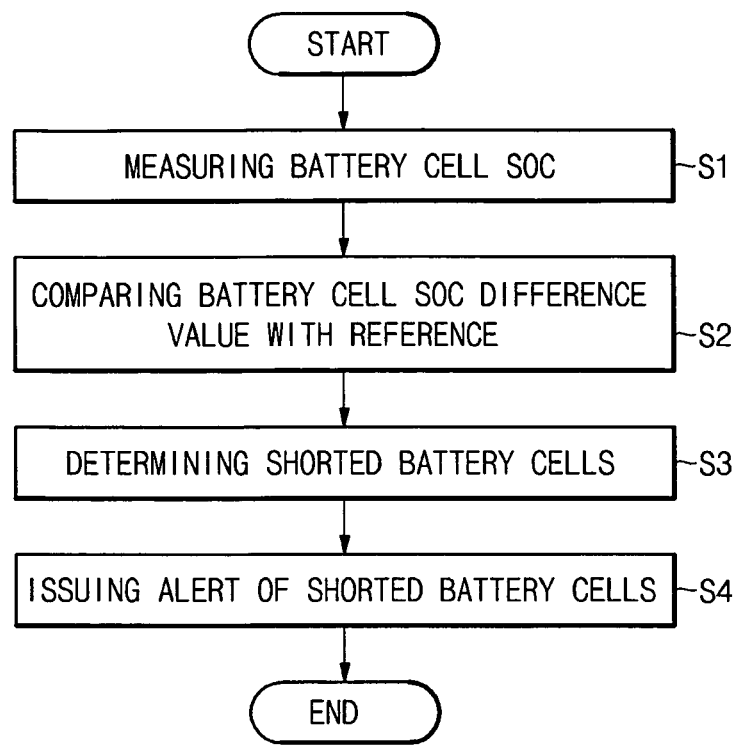
FIG. 4 illustrates a flowchart of a driving method for a BMS according to an embodiment.
Figure 5A:
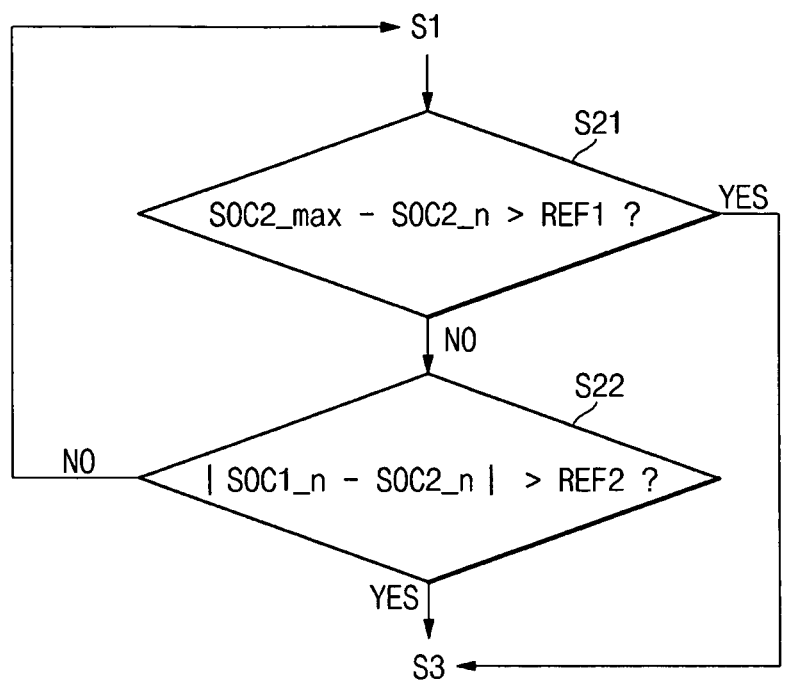
FIG. 5A illustrates an exemplary process chart for detailed comparison of reference values with SOC difference values of the battery cells of FIG. 4.
Figure 5B:
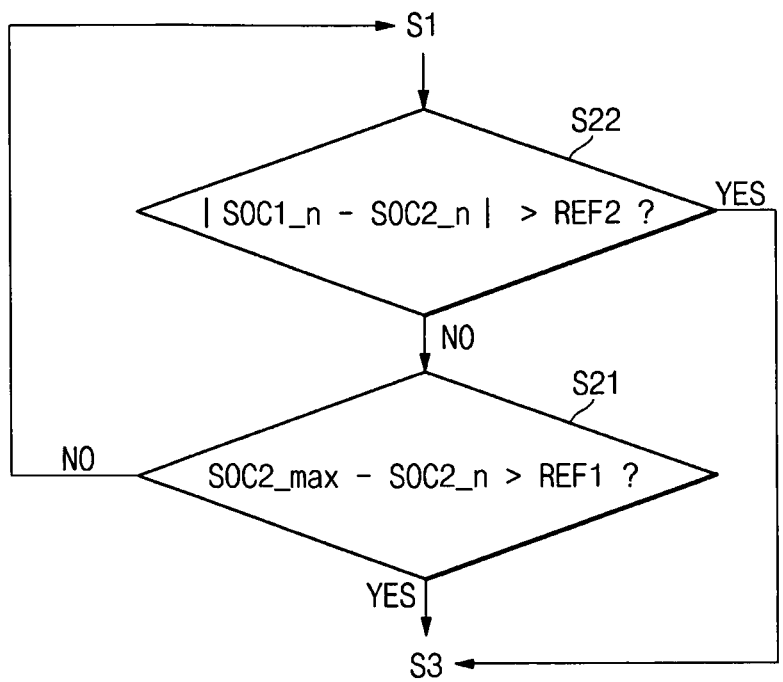
FIG. 5B illustrates another exemplary process chart for detailed comparison of reference values with SOC difference values of the battery cells of FIG. 4.

FIG. 4 illustrates a flowchart of a driving method for a BMS according to an embodiment. FIG. 5A illustrates an exemplary process chart for detailed comparison of reference values with the SOC difference values of the battery cells in FIG. 4. FIG. 5B illustrates another exemplary process chart for detailed comparison of reference values with the SOC difference values of the battery cells in FIG. 4.

Referring to FIG. 4, a driving method for a battery management system according to an embodiment may include, e.g., measuring battery cell SOCs in operation S1, comparing battery cell SOC difference values with a reference value in operation S2, determining shorted battery cells in operation S3, and issuing an alert of shorted battery cells in operation S4.

In the measuring of the battery cell SOCs in operation S1, the SOC measurer 22 of the MCU 20 may determine battery cell OCVs using cell voltage and cell current data of each of the plurality of battery cells input from the sensor unit 10 through the controller 21. The SOC measurer 22 may use the OCVs to determine the SOCs for each of the battery cells. The SOC measurer 22 may determine first SOCs of the plurality of battery cells and may determine second SOCs for the plurality of battery cells after a predetermined time elapses, which may be needed to detect shorted battery cells from among the plurality of battery cells.

Operation S2 may include operations S21 and/or S22. In the comparison of the battery cell SOC difference values with the reference value in operation S2, the controller 21 may refer to first SOCs and second SOCs determined by the SOC measurer 22, and, as illustrated in FIGS. 5A and 5B, may determine in operation S21 whether first difference values ($SOC2\_max-SOC2\_n$) between the maximum value ($SOC2\_max$) and each of the second SOCs ($SOC2\_n$; where n is a natural number) for the plurality of battery cells are greater than a first reference value (REF1). In addition, the controller 21 may determine in operation S22 whether second difference values ($|SOC1\_n-SOC2\_n|$) between the first SOCs ($SOC1\_n$; where n is a natural number) of each of the plurality of battery cells and second SOCs ($SOC2\_n$) are greater than the second reference value (REF2).

Referring to FIG. 5A, if operation S21 is first performed in operation S2 and the first difference values ($SOC2\_max-SOC2\_n$) are greater than the first reference value (REF1) in operation S21, operation S3 for determining shorted battery cells may immediately follow. In contrast, if the first difference values ($SOC2\_max-SOC2\_n$) are less than the first reference value (REF1), operation S22 may instead be performed. Performing operation S3 may signify that shorted battery cells have been detected among the plurality of battery cells. Performing operation S22 may signify that shorted battery cells were not detected by operation S21 and another method may be used to detect shorted battery cells. If the second difference values ($|SOC1\_n-SOC2\_n|$) are greater than the second reference value (REF2) in operation S22, operation S3 for determining shorted battery cells may then be performed. If the second difference values ($|SOC1\_n-SOC2\_n|$) are less than the second reference value (REF2), operation S1 may be repeated. Performing operation S1 again may signify that no shorts among the plurality of battery cells were detected.

Referring to FIG. 5B, if operation S22 is first performed in operation S2 and the second difference values (|SOC1_n−SOC2_n|) are greater than the second reference value (REF2), operation S3 for determining shorted battery cells may immediately follow. In contrast, if the second difference values (|SOC1_n−SOC2_n|) are less than the second reference value (REF2), operation S21 may instead be performed. Performing operation S3 may signify that shorted battery cells have been detected among the plurality of battery cells. Performing operation S21 may signify that no shorted battery cells were detected in operation S22 and another method may be used to detect shorted battery cells. If the first difference values (SOC2_max−SOC2_n) are greater than the first reference value (REF1) in operation S21, operation S3 for determining shorted battery cells may then be performed. If the first difference values (SOC2_max−SOC2_n) are less than the first reference value (REF1), operation S1 may be repeated. Performing operation S1 again may signify that no shorts among the plurality of battery cells were detected.

In an implementation, whether operation S21 or S22 is performed first in the comparison of the battery cell SOC differences to the reference value in operation S2 may be determined by settings in the controller 21.

In operation S3, determining shorted battery cells, the controller 21 may determine shorted battery cells as battery cells from among the plurality of battery cells for which the first difference value (SOC2_max−SOC2_n) is greater than the first reference value (REF1) or for which the second difference value (|SOC1_n−SOC2_n|) is greater than the second reference value (REF2). This determination may be based on comparison results between the battery cell SOC difference values with the reference value in operation S2.

In operation S4, issuing an alert that there are shorted battery cells, the MCU 20 may transmit information regarding the shorted battery cells to the ECU 7 to, e.g., display the information on a display device. Thus, a user may be alerted to a presence or absence of shorted battery cells.

A battery management system and a driving method for the system according to an embodiment may be capable of detecting shorted battery cells from among a plurality of battery cells by analyzing the SOCs of the battery cells and may alert a user to check the shorted battery cells. Thus, the battery management system and driving method for the system according to embodiments may allow for easy location and replacement of battery cells that have shorted and have low performance.

Also, because a battery management system and a driving method for the system according to embodiments may detect sudden shorts occurring in battery cells by periodically checking SOCs of the battery cells, explosions in vehicles induced by sudden shorts can be averted.

The BMS of an embodiment may not only effectively manage charge and discharge states of each battery cell by, e.g., measuring voltages at each battery cell and the combined voltage and current of the entire battery cell array, but may also detect cells with reduced levels of performance from among an array of battery cells and may ensure that each battery cell provides maximum performance. Accordingly, the BMS of an embodiment may improve performance of a battery.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A battery management system, comprising:
    a sensing unit, the sensing unit sensing cell voltages and cell currents of a plurality of battery cells; and
    a Main Control Unit (MCU), the MCU determining a State of Charge (SOC) of the plurality of the battery cells and controlling charging and discharging based on the cell voltages and cell currents of the plurality of the battery cells,
    wherein the MCU includes:
        an SOC measurer, the SOC measurer measuring first SOCs of each of the battery cells and, after a predetermined duration, second SOCs of each of the battery cells, and
        a controller, the controller determining whether a first difference value between a maximum value from among the second SOCs of the plurality of battery cells and the second SOCs of each battery cell is greater than a first reference value or determining whether a second difference value between the first and second SOCs of respective battery cells is greater than a second reference value, and determining which battery cell among the plurality of the battery cells is a shorted battery cell when the first difference value for the battery cell is greater than the first reference value or when the second difference value for the battery cell is greater than the second reference value, and
    wherein the controller is configured to determine whether the second difference values are greater than the second reference value if the first difference values for all the battery cells are less than the first reference value.

2. The battery management system as claimed in claim 1, wherein the MCU further includes a data storage, the data storage storing the first SOCs, the second SOCs, the first reference value, and the second reference value.

3. The battery management system as claimed in claim 1, wherein the controller is further configured to determine whether the first difference values are greater than the first reference value if the second difference values for all the battery cells are less than the second reference value.

4. The battery management system as claimed in claim 1, wherein:
    the MCU is configured to transmit information regarding the shorted battery cell to an Engine Control Unit (ECU), and
    the ECU is configured to display the information regarding the shorted battery cell on a display device.

5. A driving method for a battery management system, the driving method comprising:
    determining battery cell States of Charge (SOC) by determining first SOCs of each of a plurality of battery cells and, after a certain duration, determining second SOCs of each of the battery cells;
    comparing difference values with reference values through determining whether a first difference value between a maximum value from among the plurality of second SOCs of the battery cells and the second SOC of each battery cell is greater than a first reference value, or determining whether a second difference value between the first and second SOCs of each of the battery cells is greater than a second reference value; and determining a battery cell from among the plurality of battery cells to be a shorted battery cell when the first difference value for the battery cell is greater than the first reference value, or when the second difference value for the battery cell is greater than the second reference value, wherein the comparing of the difference values with the reference values includes:

the determining whether the first difference value between the maximum value from among the plurality of second SOCs of the battery cells and the second SOC of each battery cell is greater than the first reference value and conditionally also includes the determining whether the second difference value between the first and second SOCs of each of the battery cells is greater than the second reference value and wherein the determining whether the first difference value between the maximum value from among the plurality of second SOCs and the second SOC of each battery cell is performed prior to conditionally determining whether the second difference value between the first and second SOCs is greater than the second reference value, or determining whether the second difference value between the first and second SOCs of each battery cell is greater than the second reference value and conditionally also includes determining whether the first difference value between the maximum value from among the plurality of second SOCs of the battery cells and the second SOC of each battery cell is greater than the first reference value and wherein the determining whether the second difference value between the first and second SOCs of each battery cell is performed prior to conditionally determining whether the first difference value between the maximum value from among the plurality of second SOCs and the second SOC of each battery cell is greater than the first reference value.

6. The driving method as claimed in claim 5, wherein in the comparing of the difference values with the reference values, determining whether the second difference values are greater than the second reference values occurs on the condition that the first difference values for all the battery cells are less than the first reference value.

7. The driving method as claimed in claim 5, wherein in the comparing of the difference values with the reference values, determining whether the first difference values are greater than the first reference values occurs on the condition that the second difference values for all the battery cells are less than the second reference value.

8. The driving method as claimed in claim 5, further comprising issuing an alert on the shorted battery cells by displaying information regarding the shorted battery cells.

9. A battery management system, comprising:

a sensing unit, the sensing unit sensing cell voltages and cell currents of a plurality of battery cells; and a Main Control Unit (MCU), the MCU determining a State of Charge (SOC) of the plurality of the battery cells and controlling charging and discharging based on the cell voltages and cell currents of the plurality of the battery cells, wherein the MCU includes:

an SOC measurer, the SOC measurer measuring first SOCs of each of the battery cells and, after a predetermined duration, second SOCs of each of the battery cells, and a controller, the controller determining whether a first difference value between a maximum value from among the second SOCs of the plurality of battery cells and the second SOCs of each battery cell is greater than a first reference value or determining whether a second difference value between the first and second SOCs of respective battery cells is greater than a second reference value, and determining which battery cell among the plurality of the battery cells is a shorted battery cell when the first difference value for the battery cell is greater than the first reference value or when the second difference value for the battery cell is greater than the second reference value, and wherein the controller is configured to determine whether the first difference values are greater than the first reference value if the second difference values for all the battery cells are less than the second reference value.

10. The battery management system as claimed in claim 9, wherein the MCU further includes a data storage, the data storage storing the first SOCs, the second SOCs, the first reference value, and the second reference value.

11. The battery management system as claimed in claim 9, wherein the controller is further configured to determine whether the second difference values are greater than the second reference value if the first difference values for all the battery cells are less than the first reference value.

12. The battery management system as claimed in claim 9, wherein:

the MCU is configured to transmit information regarding the shorted battery cell to an Engine Control Unit (ECU), and the ECU is configured to display the information regarding the shorted battery cell on a display device.

* * * * *